(12) United States Patent
Shibusawa et al.

(10) Patent No.: US 9,186,879 B2
(45) Date of Patent: Nov. 17, 2015

(54) SCREEN-PRINTING STENCIL HAVING AMORPHOUS CARBON FILMS AND MANUFACTURING METHOD THEREFOR

(75) Inventors: Kunihiko Shibusawa, Gumma (JP); Takeshi Sato, Gumma (JP); Katsuo Kitsu, Gumma (JP)

(73) Assignee: TAIYO YUDEN CHEMICAL TECHNOLOGY CO., LTD., Takasaki-Shi, Gunma (JP)

( * ) Notice: Subject to any disclaimer, the term of this patent is extended or adjusted under 35 U.S.C. 154(b) by 71 days.

(21) Appl. No.: 13/700,061

(22) PCT Filed: Apr. 1, 2011

(86) PCT No.: PCT/JP2011/058425
§ 371 (c)(1),
(2), (4) Date: Mar. 12, 2013

(87) PCT Pub. No.: WO2011/148718
PCT Pub. Date: Dec. 1, 2011

(65) Prior Publication Data
US 2013/0220152 A1   Aug. 29, 2013

(30) Foreign Application Priority Data
May 28, 2010   (JP) ................................. 2010-123558

(51) Int. Cl.
*B41N 1/24* (2006.01)
*B41F 15/34* (2006.01)
(Continued)

(52) U.S. Cl.
CPC ................ *B41F 15/34* (2013.01); *B41C 1/148* (2013.01); *B41N 1/248* (2013.01); *H05K 3/1225* (2013.01)

(58) Field of Classification Search
CPC ............. B41N 1/24; B41C 1/14; B41F 15/34; B41F 15/36
USPC ..................... 101/114, 127, 127.1, 128.4, 129
See application file for complete search history.

(56) References Cited

U.S. PATENT DOCUMENTS 4,854,230 A * 8/1989 Niki et al. ...................... 101/123
5,460,316 A * 10/1995 Hefele ............................ 228/39
(Continued)

FOREIGN PATENT DOCUMENTS

JP 4-336258 11/1992
JP 5-220922 8/1993
(Continued)

OTHER PUBLICATIONS

Written Opinion dated Jun. 7, 2011 of PCT/JP2011/058425 filed Jan. 4, 2012 (6 pages).
(Continued)

*Primary Examiner* — Leslie J Evanisko
(74) *Attorney, Agent, or Firm* — Pillsbury Winthrop Shaw Pittman, LLP

(57) ABSTRACT

[Object] To provide a screen printing stencil including an amorphous carbon film, such as a DLC film, and a water-oil-repellent layer provided on at least part of the amorphous carbon film so as to exhibit high fixability.
[Solution] A screen printing plate 10 of an embodiment of the present invention includes a mesh 16 fixed to a frame body 12; an emulsion layer 14 which fills up the mesh 16 and has a print pattern opening 18; an amorphous carbon film formed on at least part of the surface of an inner wall 22 of the print pattern opening 18 and composed of at least one element of silicon, oxygen, and nitrogen; and a thin film 20 of a fluorine-containing silane coupling agent formed on at least part of the amorphous carbon film.

25 Claims, 8 Drawing Sheets

(51) Int. Cl.
*H05K 3/12* (2006.01)
*B41C 1/14* (2006.01)

(56) References Cited

U.S. PATENT DOCUMENTS 5,622,108 A * 4/1997 Benedetto et al. ............ 101/126
5,749,292 A * 5/1998 De Bastiani et al. ......... 101/129

FOREIGN PATENT DOCUMENTS

| JP | 9-265616 | 10/1997 |
| JP | 11-245371 | 9/1999 |
| JP | 2002-067267 | 3/2002 |
| JP | 2005-144973 | 6/2005 |
| JP | 2005-146060 | 6/2005 |
| JP | 2006-205716 | 8/2006 |
| JP | 2007-057722 A | 3/2007 |
| JP | 2009-045867 | 3/2009 |
| JP | 2009-174039 | 8/2009 |
| JP | 2010-202466 | 9/2010 |
| JP | 2010-247534 | 11/2010 |

OTHER PUBLICATIONS

Chinese Office Action dated Apr. 30, 2014 of Chinese Patent Application No. 201180026554.3 and English translation thereof (9 pages).
Korean Office Action dated Jun. 11, 2014 for Appln. No. 10-2012-7030436.
Extended European Search Report issued on Apr. 21, 2015 in corresponding European Patent Application No. 11786418.1 (10 pages).
Hideo Notsu et al., "Hydroxyl Groups on Boron-Doped Diamond Electrodes and Their Modification with a Silane Coupling Agent", Electrochemical and Solid-State Letters, vol. 4, No. 3, Jan. 1, 2001, pp. H1-H3, XP055049719.
Toshiki Tsuboto et al., "Surface Reforming of the Oxidized Diamond Surface with Silane Coupling Reagents", Journal of the Ceramic Society of Japan, vol. 110, No. 1286, Oct. 1, 2001, pp. 904-910, XP002738194.

* cited by examiner

SCREEN-PRINTING STENCIL HAVING AMORPHOUS CARBON FILMS AND MANUFACTURING METHOD THEREFOR

CROSS REFERENCE TO RELATED APPLICATIONS

This application is a U.S. National Stage of International Application No. PCT/JP2011/058425 filed Apr. 1, 2011, which claims the benefit of priority to Japanese Patent Application No. 2010-123558, filed May 28, 2010, the entire contents of which are incorporated herein by reference in its entirety.

TECHNICAL FIELD

The present invention relates to a screen printing stencil having an amorphous carbon film and a method for manufacturing such a screen printing stencil.

BACKGROUND ART

In a known technique for mounting an electronic component on a surface of a substrate, solder paste is applied onto the surface of the substrate by screen printing. Such screen printing is employed to apply metallic paste for forming inner electrodes of multilayer capacitors or multilayer inductors. In the screen printing, a screen printing stencil, such as a screen printing plate or a metallic mask, is disposed so as to overlie a recording medium such as a substrate, printing paste, such as solder paste or metallic plate, is then applied onto a surface of a squeegee with a scraper, and then the squeegee is moved so as to press the applied printing paste, so that the paste passes through multiple print pattern openings formed in the stencil and transferred to the recording medium. The screen printing stencil is required to have characteristics such as reduced bleeding of printing paste, smooth plate separation, and an enhanced paste-releasing property. Use of paste having high viscosity particularly demands smooth plate separation and an enhanced paste-releasing property.

In order to reduce the bleeding of printing paste and enhance plate separation and a paste-releasing property, for example, a metallic mask has been disclosed. In each of techniques proposed in Patent Literatures 1 to 3, an amorphous carbon film of, for example, diamond-like carbon (DLC) is provided on a surface of a screen printing mask or a print pattern opening to reduce the bleeding of printing paste and enhance plate separation and a paste-releasing property. Unfortunately, since the amorphous carbon film does not have an oil-repellent property and rather exhibits high affinity to a resin binder contained in paste, simply using the amorphous carbon film cannot reduce the bleeding of the paste and sufficiently enhance plate separation and a paste-releasing property.

Then, another technique has been studied, in which a DLC film is coated with fluorine. For instance, in Patent Literature 4, a DLC film is formed on a surface of the body of a mask by a chemical vapor deposition (CVD) method with fluorocarbon gas to incorporate a lubricant, such as fluorine resin, into the DLC film, so that a paste-releasing property can be enhanced and the bleeding of paste on a surface of a recording medium can be prevented.

Another technique has been also proposed, in which a fluorine-containing water-oil-repellent layer is formed on a surface of a DLC film without use of fluorine-containing gas. For instance, in a technique disclosed in Patent Literature 5, a surface treatment agent composed of highly stable perfluoroalkyl radical being an active ingredient is applied onto a surface of a DLC film formed on each surface of various solid substances, and then fluorine coating is further provided on the surface treating agent.

CITATION LIST

Patent Literature

Patent Literature 1: Japanese Unexamined Patent Application Publication No. 11-245371
Patent Literature 2: Japanese Unexamined Patent Application Publication No. 2002-67267
Patent Literature 3: Japanese Unexamined Patent Application Publication No. 2005-144973
Patent Literature 4: Japanese Unexamined Patent Application Publication No. 2006-205716
Patent Literature 5: Japanese Unexamined Patent Application Publication No. 2005-146060

SUMMARY

The fluorine coating layer having a water-oil repellent property and formed on the DLC film, however, exhibits unsatisfactory fixability to the DLC film. In addition, since part of a screen printing stencil, such as the contact portion between a surface of a squeegee and the component of the stencil, needs to exhibit sufficient wettability, it is undesirable in some cases that the fluorine coating layer be entirely provided to the screen printing stencil.

Various embodiments of the present invention provide screen printing stencils each having an amorphous carbon film, such as a DLC film, and a water-oil-repellent layer provided on at least part of the amorphous carbon film so as to exhibit satisfactory fixability.

The inventors have found that an amorphous carbon film composed of at least one element selected from the group consisting of silicon (Si), oxygen (O), and nitrogen (N) can hold a fluorine-containing silane coupling agent with satisfactory fixability. A thin film of a fluorine-containing silane coupling agent is formed on part of a surface of such an amorphous carbon film to impart a water-oil-repellent property to this part, which induces a strong chemical bond between the amorphous carbon film and the thin film of a silane coupling agent, such as a covalent bond due to a dehydration condensation reaction or a hydrogen bond. The silane coupling agent is thus held on the amorphous carbon film with high fixability.

An embodiment of the present invention provides a screen printing plate including a mesh fixed to a frame body; an emulsion layer that fills up the mesh and has a through-hole; an amorphous carbon film formed on at least part of the inner wall of the through-hole and composed of at least one element of silicon, oxygen, and nitrogen; and a thin film of a fluorine-containing silane coupling agent formed on at least part of the amorphous carbon film.

Another embodiment of the present invention provides a screen printing mask including a mask substrate directly attached to a frame body or indirectly attached through a mesh, the mask substrate having a through-hole; an amorphous carbon film formed on at least part of the inner wall of the through-hole and composed of at least one element of silicon, oxygen, and nitrogen; and a thin film of a fluorine-containing silane coupling agent formed on at least part of the amorphous carbon film. Another embodiment of the present invention provides a screen printing mask including a mesh fixed to a frame body; a mask substrate attached to one surface of the mesh and having a through-hole; an amorphous carbon film formed on at least part of the inner wall of the through-hole and composed of at least one element of silicon, oxygen, and nitrogen; and a thin film of a fluorine-containing silane coupling agent formed on at least part of the amorphous carbon film.

Another embodiment of the present invention provides a method for manufacturing a screen printing plate, the method including fixing a mesh to a frame body; filling up the mesh with an emulsion to form an emulsion layer; forming a through-hole in the emulsion layer at a position corresponding to a print pattern; forming an amorphous carbon film on at least part of the inner wall of the thorough-hole, the amorphous carbon film being composed of at least one element of silicon, oxygen, and nitrogen; and forming a thin film of a fluorine-containing silane coupling agent on at least part of the amorphous carbon film.

Another embodiment of the present invention provides a method for manufacturing a screen printing mask, the method including directly fixing a mask substrate to a frame body or indirectly fixing the mask substrate through a mesh; forming a through-hole in a metallic plate at a position corresponding to a print pattern; forming an amorphous carbon film on at least part of the inner wall of the thorough-hole, the amorphous carbon film being composed of at least one element of silicon, oxygen, and nitrogen; and forming a thin film of a fluorine-containing silane coupling agent on at least part of the amorphous carbon film. Another embodiment of the present invention provides a method for manufacturing a screen printing mask, the method including fixing a mesh to a frame body; attaching a mask substrate to one surface of the mesh, the mask substrate having a through-hole; forming an amorphous carbon film on at least part of the inner wall of the thorough-hole, the amorphous carbon film being composed of at least one element of silicon, oxygen, and nitrogen; and forming a thin film of a fluorine-containing silane coupling agent on at least part of the amorphous carbon film.

ADVANTAGES

Various embodiments of the present invention provide screen printing plates and screen masks each having an amorphous carbon film, such as a DLC film, and a water-oil-repellent layer provided on at least part of the amorphous carbon film so as to exhibit satisfactory fixability.

DESCRIPTION OF EMBODIMENTS

Figure 1:
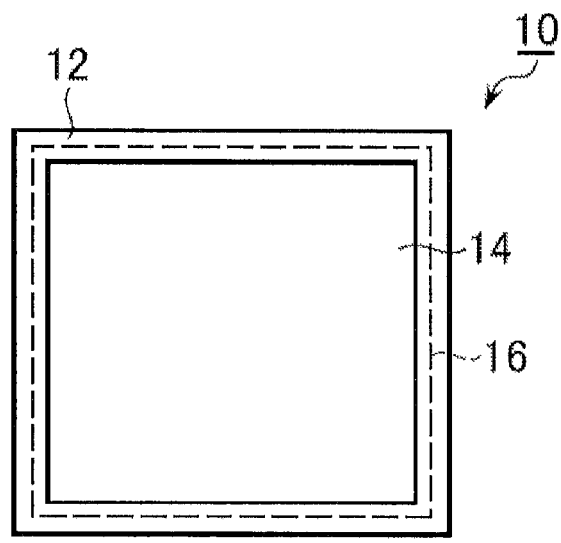
FIG. 1 is a schematic plan view illustrating the general configuration of a screen printing plate according to an embodiment of the present invention.
Figure 2:
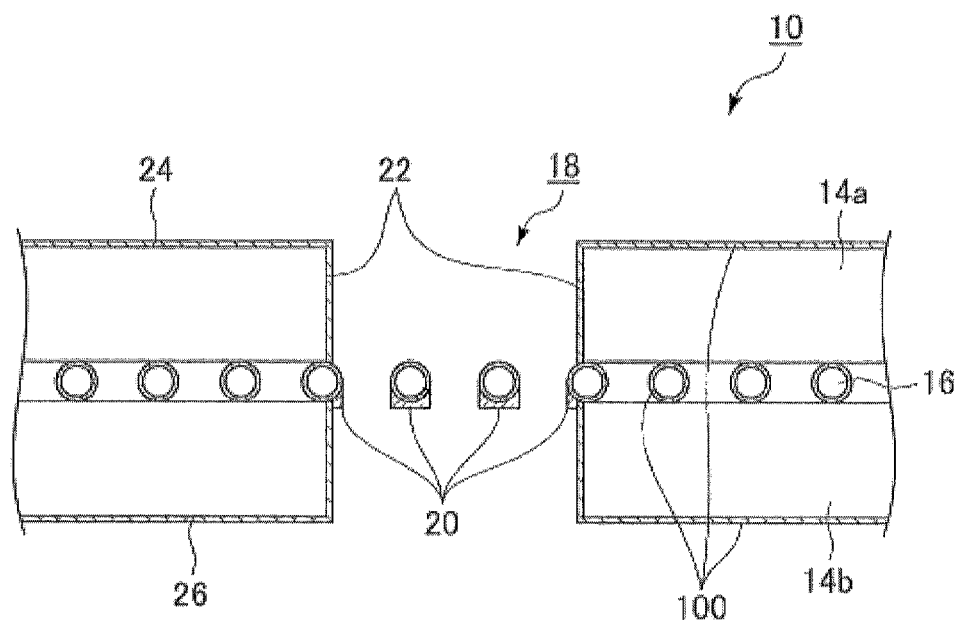
FIG. 2 is a schematic cross-sectional view illustrating the screen printing plate according to the embodiment of the present invention.

Various embodiments of the present invention will now be described with reference to the accompanying drawings. In each of the embodiments, the same components are denoted by the same reference signs for explanation, and the detailed description of the same components is appropriately omitted. FIG. 1 is a schematic plan view illustrating the general configuration of a screen printing plate according to an embodiment of the present invention, and FIG. 2 is a schematic cross-sectional view illustrating the screen printing plate according to an embodiment of the present invention. FIGS. 1 and 2 each schematically illustrate the configuration of the screen printing plate according to an embodiment of the present invention, and it should be noted that dimensional relationship is not accurately reflected in the drawings.

With reference to the drawings, in a screen printing plate 10 of an embodiment of the present invention, a mesh 16 formed from resin, such as polyester, or stainless steel is attached to a frame body 12 formed from cast iron, stainless steel, or aluminum alloy, and an emulsion 14 is entirely or partially applied to the mesh 16.

For instance, threads of metal, resin, or carbon fibers are woven into the mesh 16. The mesh 16 to be used, for example, has a 15 μm diameter φ of a thread, a 23 μm thickness, a 24.7 μm width of a mesh opening, and a 640 mesh count (640 meshes per inch). In an embodiment, the intersections between the threads of the mesh are compressed, which can reduce the thickness of the mesh 16 to the thickness of the thread of the mesh. In the mesh 16, the material, the diameter of the thread, and the mesh count are not limited to those described herein and can be appropriately changed depending on a print target.

In an embodiment, for example, a diazo sensitive emulsion can be used as the emulsion 14. A print pattern opening 18 is formed in the emulsion 14 by, for example, a photolithographic method so as to correspond to a print pattern. The print pattern opening 18 is formed so as to penetrate the emulsion 14 in the thickness direction. In a photolithographic process, the emulsion 14 applied to the mesh 16 is exposed to light with a mask pattern being a photo mask to cure part of the emulsion 14, and then the other region of the emulsion 14 than the part cured by the exposure to light is removed to leave only the cured part on the mesh 16, so that the print pattern opening 18 is formed. The print pattern opening 18 is defined by inner walls 22 in the emulsion 14. In place of the emulsion 14, metallic foil patterned in a print pattern (having a through-hole equivalent to the print pattern opening 18) and formed from nickel, nickel alloy, stainless steel, or the like may be attached to the mesh 16. Furthermore, in place of directly attaching the mesh 16 provided with a print pattern to the frame 12, a support screen (not illustrated) being a component different from the mesh 16 may be attached to the frame 12, and then the mesh 16 may be attached to the support screen. In an embodiment, part of the support screen which overlaps the mesh 16 is removed with a cutter knife.

In an embodiment, an amorphous carbon film 100 is formed on a surface of each thread of the mesh 16. The amorphous carbon film 100 is, for example, an a-C:H:Si film primarily composed of carbon (C), hydrogen (H), and silicon (Si). The Si content in the film is, for instance, in the range of 4 to 50 atomic %, preferably 10 to 40 atomic %. The amorphous carbon film 100 of an embodiment of the present invention can be formed by, for example, a plasma chemical vapor deposition (CVD) method. Examples of reaction gas used as a silicon source include tetramethylsilane, methylsilane, dimethylsilane, trimethylsilane, dimethoxydimethylsilane, and tetramethylcyclotetrasiloxane. Since the amorphous carbon film 100 formed on the mesh 16 exhibits high affinity to adhesives, the mesh 16 can be steadily fixed to the frame body 12 with an adhesive or an adhesive tape. In addition, the amorphous carbon film 100 is highly adhesive to the emulsion 14, and the emulsion 14 can be therefore steadily held by the mesh 16. In the case where the above-mentioned metallic foil of, for example, nickel is provided in place of the emulsion 14, the amorphous carbon film 100 is not provided at an attaching portion of the metallic foil and the mesh 16, which enables the metallic foil to be steadily held by the mesh 16.

Various elements can be incorporated into the amorphous carbon film of the present invention in addition to or in place of Si, which enables a below-described silane coupling agent to be held with high fixability. An a-C:H:Si:O film formed by additionally incorporating oxygen atoms (O) into an a-C:H:Si film can be, for instance, used as the amorphous carbon film. The O content in the film can be changed by adjusting the proportion of an oxygen flow rate to the total flow rate of Si-containing main source gas and oxygen. The proportion of an oxygen flow rate to the total flow rate of main source gas and oxygen is adjusted, for example, in the range of 0.01 to 12%, preferably 0.5 to 10%. The amorphous carbon film of the present invention may be an a-C:H:Si:O:N film formed by additionally incorporating nitrogen (N) into an a-C:H:Si:O film or an a-C:H:Si:N film formed by exposing an a-C:H:Si film to nitrogen plasma.

A film into which any one or both of O and N are incorporated in place of Si may be used (e.g., an a-C:H:O film, an a-C:H:N film, or an a-C:H:O:N film). Oxygen or nitrogen can be incorporated into the amorphous carbon film by, for instance, plasma treatment of a surface of the amorphous carbon film with nitrogen, oxygen, or a mixture thereof. The plasma treatment can be carried out in parallel with or in continuity with formation of the amorphous carbon film in the same apparatus as that for forming the amorphous carbon film without vacuum break. The plasma-treated surface of the amorphous carbon film has various functional groups such as Si—OH, and these functional groups interact with the functional groups contained in a fluorine-containing silane coupling agent which will be described later, which can further enhance adhesion of the fluorine-containing silane coupling agent to the surface of the amorphous carbon film.

A thin film 20 of a fluorine-containing silane coupling agent is formed on at least part of the amorphous carbon film 100 on a surface of the mesh 16. The thin film 20 of a fluorine-containing silane coupling agent is tightly fixed to the amorphous carbon film 100 formed on a surface of the mesh 16 by a chemical bond such as a covalent bond due to a dehydration condensation reaction or a hydrogen bond. A product "FG-5010Z130-0.2" manufactured by Fluoro Technology Corporation can be, for instance, used as the fluorine-containing silane coupling agent. In an embodiment, the thin film 20 is formed so as to have a small thickness which has substantially no influence on the volume of printing paste which passes through the print pattern opening 18; for example, the thickness is approximately 20 nm. The thickness of the thin film 20 is not limited thereto and can be appropriately changed depending on types of fluorine-containing silane coupling agent to be used; for instance, the thickness ranges from 1 nm to 1 μm.

The amorphous carbon film 100 is formed by a plasma CVD method as described above so as to cover a surface of the emulsion 14 or metallic foil of nickel or the like without filling up the uneven surface profile thereof. Application of the silane coupling agent to the amorphous carbon film 100 formed in this manner enables application of the silane coupling agent also to hollows in a surface of the emulsion 14. The layer of a fluorine-containing silane coupling agent in the hollows is protected by a hard amorphous carbon film 100 formed on protrusions on a surface of the emulsion 14 and is therefore less likely to be peeled by friction. Hence, the thin film 20 of the fluorine-containing silane coupling agent can be further held on a surface of the amorphous carbon film 100 for a long period.

As described above, the thin film 20 is formed on at least part of the amorphous carbon film 100. In an embodiment, the thin film 20 may be formed on the lower surface 26 side of the threads of the mesh 16 as illustrated in FIG. 2. The thin film 20 can be, for instance, formed by applying a solution of the fluorine-containing silane coupling agent onto a surface of the mesh 16. The application of the fluorine-containing silane coupling agent and dip in the solution of a fluorine-containing silane coupling agent can be carried out in the atmosphere; hence, as compared with a procedure in vacuum, the thin film 20 is readily provided to part of the screen printing plate 10 which needs a water-oil-repellent property, such as the lower surface 26 side of the mesh 16 exposed in the print pattern opening 18.

In the use situation, the screen printing plate 10 having such a configuration is disposed such that the lower surface 26 of the emulsion 14 faces a recording medium. After the screen printing plate 10 is disposed at a predetermined position, printing paste, such as solder paste or metallic plate for forming an inner electrode, is applied onto an upper surface 24, and then a squeegee (not illustrated) is slid along the upper surface 24 while the upper surface 24 is pressed by the squeegee at a certain level of pressure, so that the applied printing paste passes through the print pattern opening 18 and is then transferred to the recording medium.

An example of a method for manufacturing the screen printing plate 10 will now be described. The frame body 12 made from cast iron, stainless steel, or aluminum alloy and the mesh 16 having a surface on which the amorphous carbon film 100 is formed by a plasma CVD method or another technique are prepared, and the mesh 16 is attached to the frame body 12. The mesh 16 may be directly attached to the frame body 12 or indirectly attached through a support screen. Then, the sensitive emulsion 14 is applied to the mesh 16, and the print pattern opening 18 corresponding to a print pattern is formed in the emulsion 14 by a photolithographic method. Then, the thin film 20 of a fluorine-containing silane coupling agent is formed on the lower surface 26 side of the mesh 16 exposed in the print pattern opening 18 to complete the screen printing plate 10.

As described above, in the screen printing plate 10 of an embodiment of the present invention, the thin film 20 of a fluorine-containing silane coupling agent is formed on at least part of the amorphous carbon film 100 formed on a surface of the mesh 16, the thin film 20 of a fluorine-containing silane coupling agent exhibiting a high water-oil-repellent property and being strongly and chemically bonded to the amorphous carbon film 100. The thin film 20 exhibiting a high water-oil-repellent property prevents printing paste from being left in the print pattern opening 18 during a printing process, which can enhance plate separation and a paste-releasing property. In an embodiment, the thin film 20 is formed on the lower surface 26 side of the mesh 16 exposed in the print pattern opening 18. The thin film 20 of a fluorine-containing silane coupling agent can be selectively provided to such a portion at which printing paste is particularly likely to remain. In an embodiment, since a fluorine-containing silane coupling agent is tightly bonded to the modified amorphous carbon film 100, the fluorine-containing silane coupling agent does not need to be fixed with a liquid primer. This can prevent problems due to use of a liquid primer, such as increased film thickness and clogging of the printing pattern opening 18.

Figure 3:
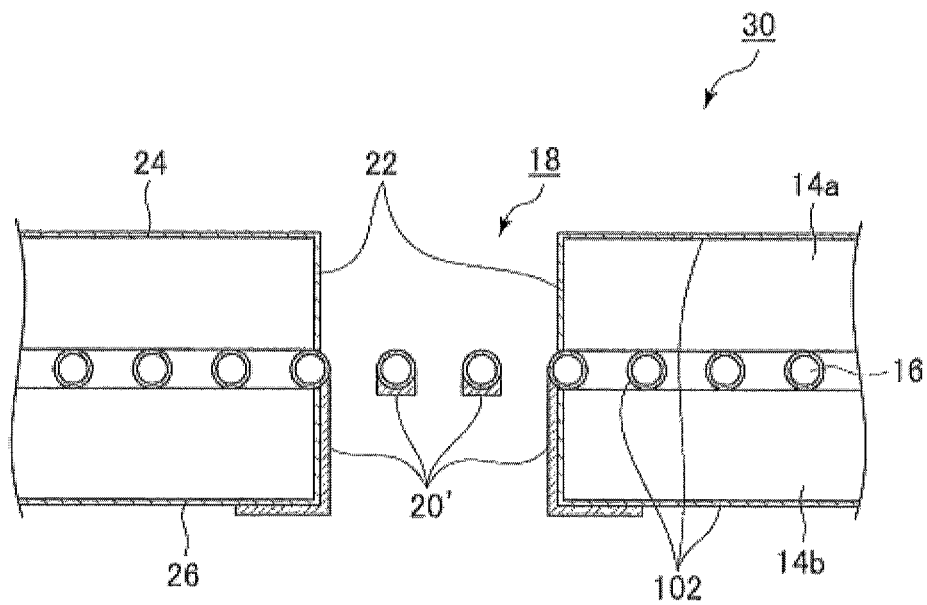
FIG. 3 is a schematic cross-sectional view illustrating a screen printing plate according to another embodiment of the present invention.

FIG. 3 is a schematic cross-sectional view illustrating a screen printing plate 30 of another embodiment of the present invention. With reference to the drawing, in the screen printing plate 30, a thin film 20' of a fluorine-containing silane coupling agent is formed not only on the lower side of the mesh 16 but also on the lower surface 26 side of the inner wall 22 relative to the mesh 16 and on the lower surface 26 of the emulsion 14 in the vicinity of the print pattern opening 18.

A method for manufacturing the screen printing plate 30 will now be described. The frame body 12 made from cast iron, stainless steel, or aluminum alloy and the mesh 16 are prepared, and the mesh 16 is attached to the frame body 12. The amorphous carbon film 102 may be or may not be formed on a surface of the mesh 16. Then, the sensitive emulsion 14 is applied to the mesh 16, and the print pattern opening 18 is formed in the emulsion 14 by a photolithographic method. Then, the amorphous carbon film 102 is formed on the inner wall 22, upper surface 24, and lower surface 26 of the emulsion 14 and the exposed portion of the mesh 16 by a plasma CVD method. In this case, the amorphous carbon film 102 may be formed on the mesh 16 in advance of the attachment thereof to the frame body 12. The same source gas of the amorphous carbon film as used in the formation of the screen printing plate 10 can be used. Then, a fluorine-containing silane coupling agent is applied onto the amorphous carbon film 102 to form the thin film 20' of the fluorine-containing silane coupling agent. Through these processes, the screen printing plate 30 can be produced. The thin film 20' is formed by applying the fluorine-containing silane coupling agent to the lower surface 26 side of the mesh 16, the lower part of the inner wall 22 relative to the mesh 16, and the lower surface 26 of the emulsion 14 in the vicinity of the print pattern opening 18.

As described above, in the screen printing plate 30 of an embodiment of the present invention, the thin film 20' of a silane coupling agent is formed on the amorphous carbon film 102 with high fixability so as to coat at least part of the mesh 16 and the inner wall 22 of the print pattern opening 18, the thin film 20' of a silane coupling agent having a satisfactory water-oil-repellent property. Hence, printing paste is further prevented from being left in the print pattern opening 18 during a printing process, which can further enhance plate separation and a paste-releasing property. Since the thin film 20' of a silane coupling agent is formed also on the lower surface 26 of the emulsion 14 in the vicinity of the print pattern opening 18, the bleeding of printing paste can be reduced during a printing process, and the thin film 20' can function as a buffer between the screen printing plate 30 and a recording medium to protect the recording medium from damage due to contact with the screen printing plate 30. In an embodiment of the present invention, the amorphous carbon film 102 has wettability higher than that of the emulsion 14, so that the high wettability of the amorphous carbon film 102 formed on the upper surface 24 of the emulsion 14 enables printing paste to be evenly applied onto the emulsion 14.

Figure 4:
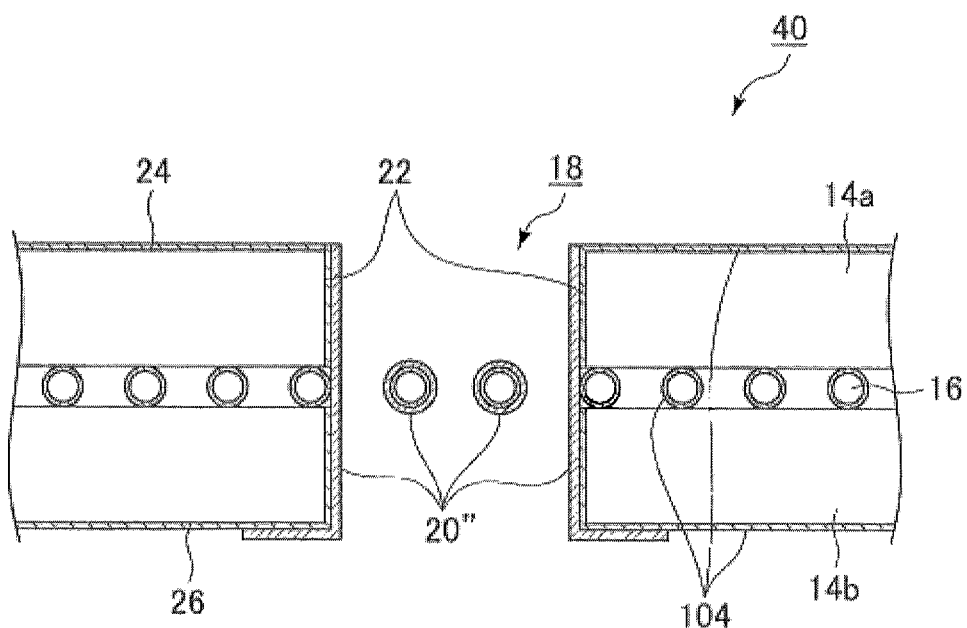
FIG. 4 is a schematic cross-sectional view illustrating a screen printing plate according to another embodiment of the present invention.

FIG. 4 is a schematic cross-sectional view illustrating a screen printing plate 40 of another embodiment of the present invention. With reference to the drawing, in the screen printing plate 40, a thin film 20" of a fluorine-containing silane coupling agent is also formed on the upper side of the mesh 16 and the upper part of the inner wall 22. Hence, printing paste is further prevented from being left in the print pattern opening 18 during a printing process, which can further enhance plate separation and a paste-releasing property. The screen printing plate 40 can be formed by the same method as used for manufacturing the screen printing plate 30. Accordingly, amorphous carbon film 104 may be formed on the inner wall 22, the upper surface 24, and the lower surface 26 of the emulsion 14, as well as exposed portions of the mesh 16.

Figure 5:
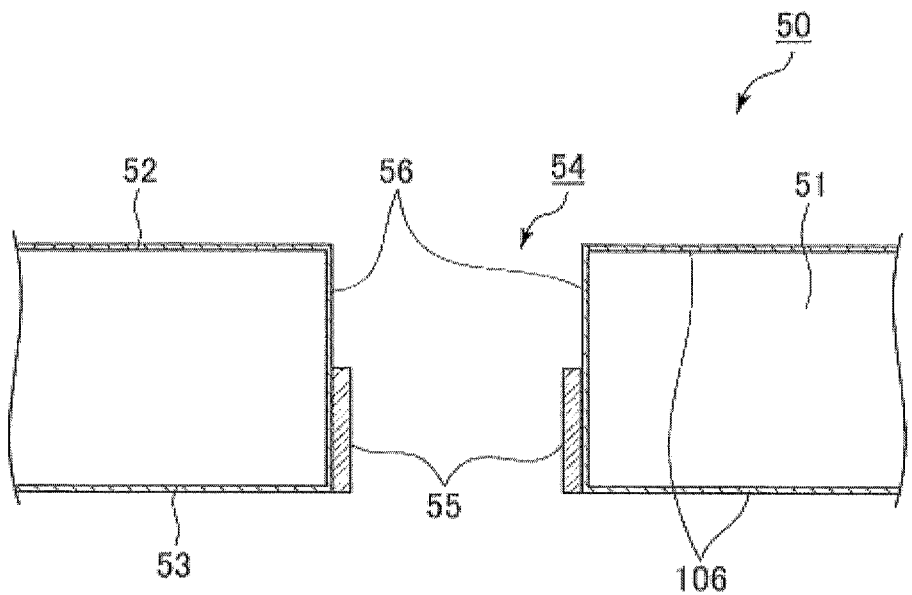
FIG. 5 is a schematic cross-sectional view illustrating a metallic mask according to an embodiment of the present invention.

FIG. 5 is a schematic cross-sectional view illustrating a metallic mask 50 of another embodiment of the present invention. With reference to the drawing, in the metallic mask 50 of an embodiment of the present invention, a print pattern opening 54 corresponding to a print pattern is formed in a single mask plate 51 of metal such as steel use stainless (SUS) by a typical technique such as etching, punching press, drilling, or laser machining. A wide variety of materials may be used for the single mask plate 51, and examples of the material of the single mask plate 51 include resins such as vinyl chloride resin, acrylic resin, and polycarbonate; ceramics; and cellulose materials. The single mask plate 51 may have a laminate structure in which multiple layers, for example, including sensitive resin such as an emulsion, resin such as polyimide or polyimideamide, and a protective tape are laminated on the above-mentioned metallic plate. An amorphous carbon film 106 is formed on the single mask plate 51 having the print pattern opening 54 by the above-mentioned technique such as a plasma CVD method. In an embodiment, the amorphous carbon film 106 is formed on an upper surface 52 and lower surface 53 of the single mask plate 51 and an inner wall 56 therein. A thin film 55 of a fluorine-containing silane coupling agent is formed on the amorphous carbon film 106 on the lower surface 53 side of the inner wall 56 relative to the center in the thickness direction. The thin film 55 can be formed through the same process as employed for the formation of the thin film 20. In the use situation, the metallic mask 50 is disposed such that the lower surface 53 faces a recording medium, and printing paste is applied onto the upper surface 52. Then, a squeegee is slid along the upper surface while the upper surface is pressed by the squeegee at a certain level of pressure, so that the applied printing paste passes through the print pattern opening 54 and is then transferred to the recording medium.

As described above, in the metallic mask 50 of an embodiment of the present invention, the thin film 55 of a silane coupling agent is formed with high fixability on at least part of the inner wall 56 of the print pattern opening 54 through which printing paste passes, the thin film 55 of a silane coupling agent having a satisfactory water-oil-repellent property. The thin film 55 exhibiting a high water-oil-repellent property prevents printing paste from being left in the print pattern opening 54 during a printing process, which can enhance plate separation and a paste-releasing property.

Figure 6:
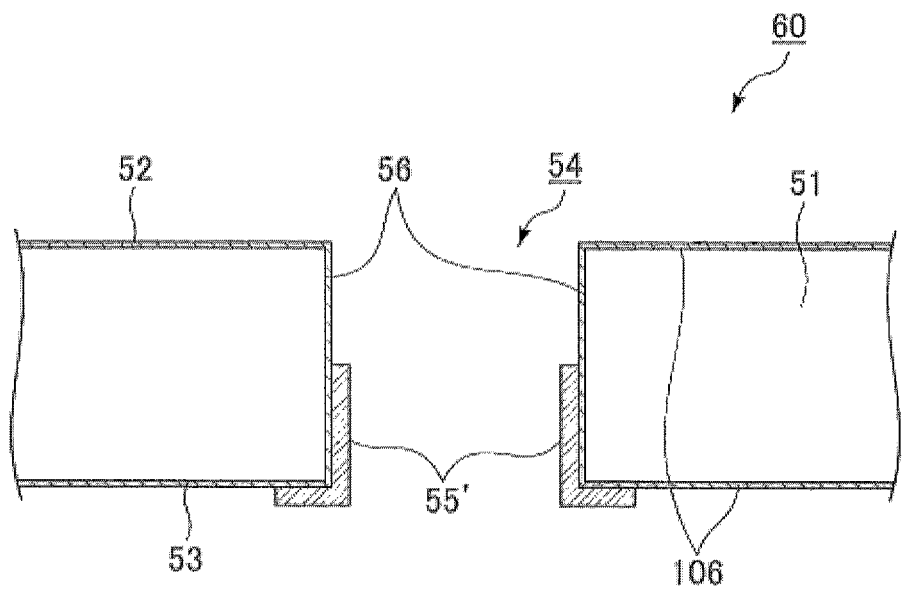
FIG. 6 is a schematic cross-sectional view illustrating a metallic mask according to another embodiment of the present invention.
Figure 7:
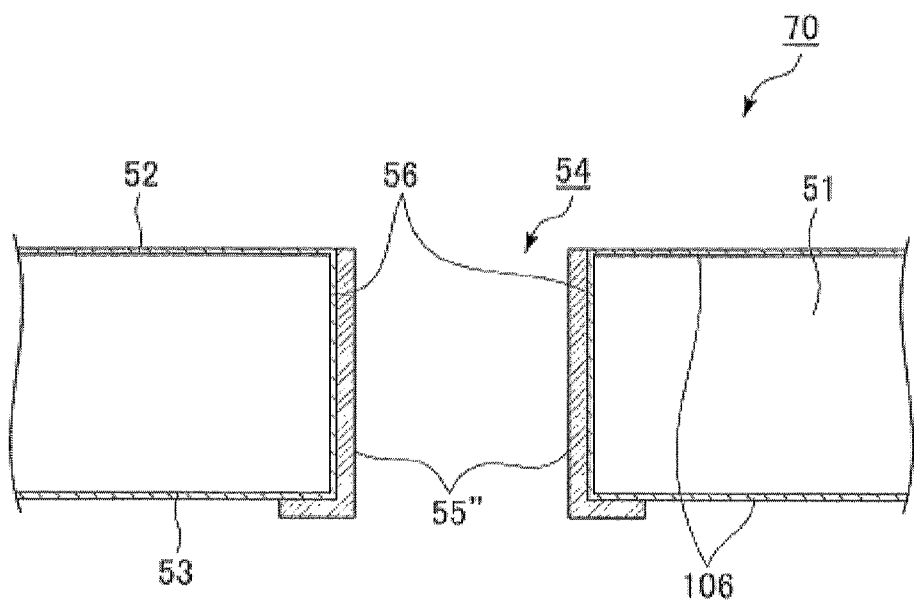
FIG. 7 is a schematic cross-sectional view illustrating a metallic mask according to another embodiment of the present invention.

The thin film 55 of a fluorine-containing silane coupling agent provided to the metallic mask may be formed at a site other than that in FIG. 5. FIGS. 6 and 7 illustrate other examples. In a metallic mask 60 illustrated in FIG. 6, for example, a thin film 55' of a silane coupling agent is formed on the lower surface 53 side of the inner wall 56 of the print pattern opening 54 and also formed on the lower surface 53 of the single mask plate 51 in the vicinity of the print pattern opening 54. Hence, in addition to an enhancement in a paste-releasing property, the bleeding of printing paste can be reduced during a printing process, and the thin film 55' can function as a buffer between the metallic mask 60 and a recording medium to protect the recording medium. In a metallic mask 70 illustrated in FIG. 7, an amorphous carbon film (not illustrated) and a thin film 55" of a fluorine-containing silane coupling agent are formed on the entire inner wall 56 of the print pattern opening 54 and on the lower surface 53 of the single mask plate 51 in the vicinity of the print pattern opening 54. Hence, plate separation and a paste-releasing property can be further enhanced.

As described above, in each of the screen printing plate and metallic mask of various embodiments of the present invention, a modified amorphous carbon film 106 is formed on at least part of the inner wall of an opening, and a fluorine-containing silane coupling agent is applied onto a surface of the amorphous carbon film 106, which can further prevent printing paste from being left in the opening during a printing process and further enhance plate separation and a paste-releasing property.

EXAMPLES

Formation of Patterned Ni Foil through Electroforming Process and Formation of Carbon Film Stainless steel (SUS304) was buffed for surface finishing in a thickness of 0.3 mm and then cut into 95 mm squares, and each of the cut pieces was degreased. A photoresist ("THB-126N", commercially available from JSR Corporation) was applied to the product with a spin coater ("1H-DX II", commercially available from MIKASA CO., LTD) at 2500 RPM or less, and then the product was dried at 90° C. for 5 min with a hot plate ("sefi SHAMAL HOTPLATE HHP-401" manufactured by IUCHI). The product was exposed to light at 600 mJ/cm$^2$ with an ultraviolet exposure apparatus (manual mask aligner "MicroTec MA6", commercially available from SÜSS MicroTec AG.) thorough a glass dry plate which had been preliminarily formed to enable printing of a grid of 40 μm wide line and space. The product was immersed into a developer and then manually swung for 75 sec (swung after 15 sec rest) for development. The resist had a thickness of approximately 40 μm.

The resulting mold was subjected to a plating process with a plating solution of Ni sulfamate for 50 min at a current of 1.8 A and a current density of 2.4 A/dm$^2$. Then, the resist was removed with a dedicated resist remover (THB-S2). A process for removing deposit on a surface of the Ni foil by mechanical polishing or another technique was omitted. Then, the patterned Ni foil was separated from the stainless steel (SUS304) plate being an electroforming mold and then fixed to form an amorphous carbon film on the entire surface of the Ni foil other than the site for a contact with an electrode.

The Ni foil fixed to an SUS plate jig was disposed in a high-pressure pulsed plasma CVD apparatus, and then the apparatus was evacuated with vacuum to $1 \times 10^{-3}$ Pa. Argon gas was fed at a flow rate of 30 CCM, a gas pressure of 2 Pa, a pulse frequency of 10 kHz, and a pulse width of 10 μs, and a substrate was cleaned by argon gas plasma for approximately 5 min. Then, trimethylsilane was fed at a flow rate of 40 SCCM and a gas pressure of 2 Pa to form a film at an applied voltage −7 kV, a pulse frequency of 10 kHz, and a pulse width of 10 μs for 10 min. In particular, the film formation process was carried out for 5 min, the product was then allowed to stand for 20 min for cooling, and then the film formation process was carried out for additional 5 min; the film formation process was carried out for 10 min in this manner.

A tetron mesh was attached to an aluminum alloy frame having a size of 240 mm by 290 mm for a printing mask, and the Ni foil after the film formation process was temporarily fixed to the center of the tetron mesh. Adhesives EX-582CA (main material) and EX-582CB (curing material) (each being commercially available from Aica Kogyo Company, Limited) were applied at a ratio of 2:1, respectively, to the tetron mesh side of the product at an overlap width of approximately 1 cm. The product was then disposed into a drying furnace at 50° C. for 45 min to cure the adhesives. Then, the dried tetron mesh was removed from the drying furnace, and the region of the tetron mesh corresponding to the Ni foil was cut out. Then, an aluminum tape was applied to the entire surface of the tetron mesh to yield a stencil mask.

A coating agent composed of fluorine (FG-5010Z130-0.2 manufactured by Fluorosurf Corporation) was applied onto the print substrate-contacting side of the produced stencil mask with a brush and then dried for two days to produce an Ni electroformed stencil mask having a water-oil-repellent surface structure.

In order to evaluate an enhancement in printing performance in the present invention, as described below in detail, a printing test was carried out with a stainless steel (SUS) mesh having a surface on which a water-oil-repellent thin film was formed.

A mesh ("SC500-18-18" commercially available from OSAKA MESH CO., LTD) was cut into a 140 mm square. The cut mesh was pinched with stainless steel (SUS304) plates for masking such that the half regions of both the lower and upper sides of the mesh were hidden, and then the product was put into a high-pressure pulsed plasma CVD apparatus. The high-pressure pulsed plasma CVD apparatus was evacuated with vacuum to $1 \times 10^{-3}$ Pa, and then argon gas was fed at a flow rate of 30 CCM, a gas pressure of 2 Pa, a pulse frequency of 10 kHz, and a pulse width of 10 μs to clean a substrate with argon gas plasma for approximately 5 min. Then, trimethylsilane was fed as reaction gas at a flow rate of 40 SCCM and a gas pressure of 2 Pa to form a film on the cleaned mesh at an applied voltage −7 kV, a pulse frequency of 10 kHz, and a pulse width of 10 μs for 10 min, so that an amorphous carbon film was formed on a surface of the stainless steel (SUS) mesh.

Then, a stainless steel (SUS304) plate was attached to an aluminum frame having a size of 240 mm by 290 mm. The stainless steel (SUS304) plate had a thickness of 0.6 mm and a 130 mm square of a through-hole formed at the center of the plate. The stainless steel (SUS) mesh was temporarily fixed to the stainless steel (SUS304) plate so as to cover the through-hole. Then, the stainless steel (SUS) mesh was glued to the stainless steel (SUS304) plate with an adhesive ("Aron Alpha 203TX"). The glued stainless steel (SUS) mesh and stainless steel (SUS304) plate were put into a drying furnace to cure the adhesive. After the curing of the adhesive, the bonded portion between the stainless steel (SUS304) plate attached to the aluminum frame and the stainless steel (SUS) mesh was sealed up with an aluminum adhesive tape such that the stainless steel (SUS) mesh was exposed by an area of a 120 mm square.

A coating agent composed of fluorine (FG-5010Z130-0.2 manufactured by Fluorosurf Corporation) was applied onto the amorphous carbon film formed on the stainless steel (SUS) mesh of the produced screen printing plate and then dried for two days. Isopropyl alcohol (IPA) was sprayed to the entire surface of the dried stainless steel (SUS) mesh with an atomizer, and then the two sides of the exposed part of the stainless steel mesh were wiped with a piece of non-woven cloth holding IPA to yield a test screen printing plate.

Then, the test screen printing plate produced as described above was subjected to a printing test. A printer "MK-850-SV" manufactured by MINAMI Co., Ltd. was used. The frame of the test screen printing plate was put on the printer through a mask adapter. Then, a urethane squeegee having a hardness of 70 was cut in a length of 110 mm and then attached to a squeegee holder. On-contact printing was carried out at a squeegee speed: approximately 20 mm/S, a degree of pushing the squeegee: pushing (lift) of 1.25 mm (in view of the squeegee contacting the SUS mesh in a parallel state), and a squeegee attack angle: 60°. Then, permeability of paste was analyzed.

Slurry of Ni—Zn—Cu ferrite was formed into a magnetic sheet having a thickness of approximately 30 μm by a green sheet method, and the magnetic sheet was cut and then attached to the stainless steel (SUS304) plate to prepare a print substrate (recording medium). Printing paste "X73485-13" (manufactured by NAMICS CORPORATION, Ag paste, particle size φ: 1 μm, viscosity: 300 Pa's) was used The printing paste "X73485-13" is intended for printing of a thin film, has high viscosity, and is likely to remain a printing mesh.

Figure 8:
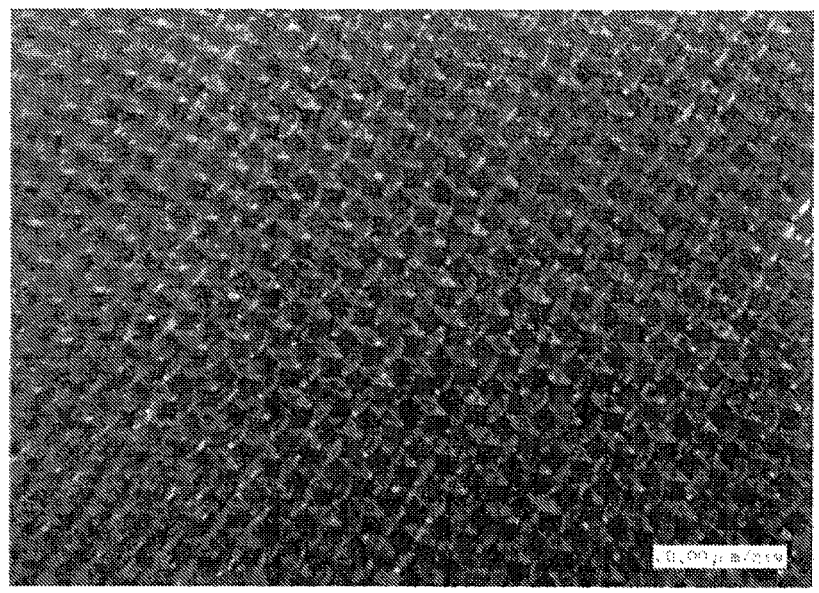
FIG. 8 is a photograph of a steel use stainless (SUS) mesh according to an embodiment of the present invention after a printing process.
Figure 9:
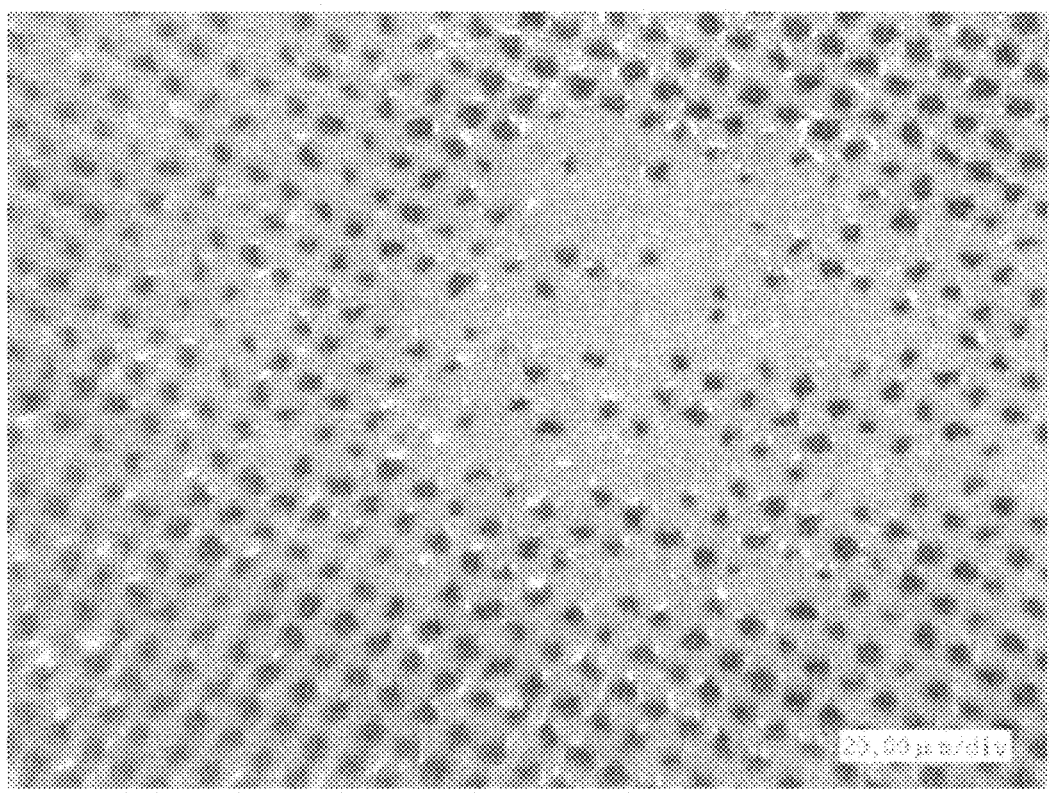
FIG. 9 is a photograph of a fluorine-uncoated steel use stainless (SUS) mesh after a printing process.

FIG. 8 is a photograph illustrating the fluorine-coated stainless steel (SUS) mesh described above after application of the printing paste "X73485-13" with this stainless steel (SUS) mesh. FIG. 9 is a photograph illustrating a stainless steel (SUS) mesh after application of the printing paste "X73485-13" with this stainless steel (SUS) mesh, the mesh being free from formation of the amorphous carbon film and the fluorine coating. In FIG. 8, no residual paste can be observed on the stainless steel (SUS) mesh. In contrast, as illustrated in FIG. 9, a large amount of paste remained on the stainless steel (SUS) mesh, which was free from formation of the amorphous carbon film and the fluorine coating, so as to fill up the mesh after the application of the paste.

Figure 10:
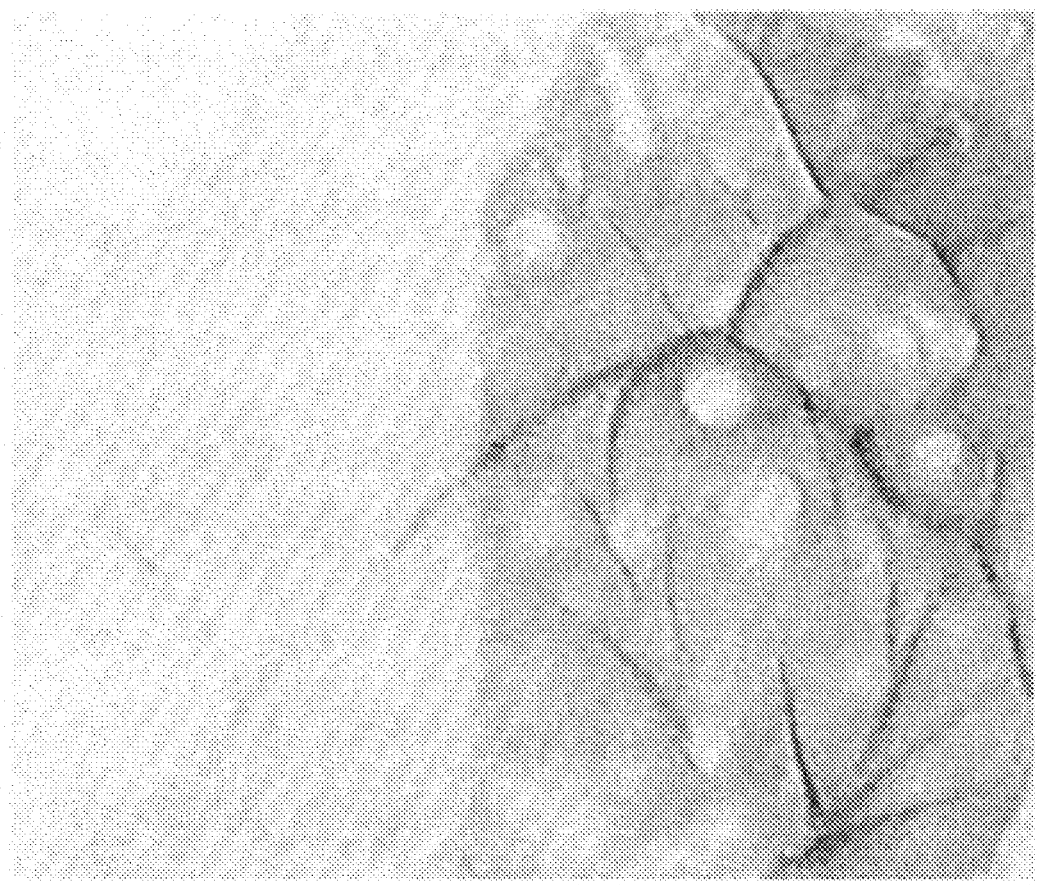
FIG. 10 is a photograph of paste applied onto a substrate with the SUS mesh according to an embodiment of the present invention.

FIG. 10 is a photograph illustrating paste applied to a substrate with a stainless steel (SUS) mesh having a fluorine-coated site and a fluorine-uncoated site. In the drawing, the left side from the center depicts paste applied through the fluorine-coated site of the stainless steel (SUS) mesh, and the right side from the center depicts paste applied through the fluorine-uncoated site of the stainless steel (SUS) mesh.

As illustrated in FIG. 10, the paste was applied to the substrate in a thin thickness through the fluorine-uncoated site of the stainless steel (SUS) mesh. Hence, the fluorine-uncoated site of the stainless steel (SUS) mesh exhibited unsatisfactory permeability of paste.

As described above, a surface of the amorphous carbon film was coated with fluorine, which was able to highly enhance the permeability of paste.

Measurement of Contact Angle

Amorphous carbon films composed of at least one element of Si, O, and N were formed on surfaces of a stainless steel pieces (SUS304, grade 2B), and samples in which the amorphous carbon films were coated with fluorine (layer of a fluorine-containing silane coupling agent) were produced as described below. Each of the samples was subjected to measurement of contact angles to mineral spirit (oil) and water (pure water) to analyze the fixability of the fluorine coating layer. Since mineral spirit is used as a diluent of printing paste in many cases, measurement of a contact angle with the mineral spirit enables evaluation of the wettability to the printing paste.

1. Production of Samples

A 30 mm square of stainless steel (SUS304) plate having a thickness of 1 mm and a surface roughness Ra of 0.034 μm was used as a substrate of each sample. The stainless steel (SUS304) plate was subjected to composite electrolytic polishing.

(1) Production in Example 1

The two stainless steel (SUS304) substrates described above were put into a high-pressure pulsed plasma CVD apparatus. The high-pressure pulsed plasma CVD apparatus was evacuated with vacuum to $1 \times 10^{-3}$ Pa, and then the substrates were cleaned with argon plasma gas for approximately 5 min. In each Example and Comparative Example, the cleaning with argon plasma gas was carried out at an argon gas flow rate of 15 SCCM, a gas pressure of 1 Pa, an applied voltage of −4 kV, a pulse frequency of 2 kHz, and a pulse width of 50 μs for 5 min. After the cleaning, argon gas and tetramethylsilane were introduced into a reaction container at flow rates of 15 SCCM and 10 SCCM, respectively, such that the reaction container had an internal gas pressure of 1.5 Pa, and an amorphous carbon film was formed at an applied voltage of −4 kV, a pulse frequency of 2 kHz, and a pulse width of 50 μs for 30 min. A solution of a fluorine-containing silane coupling agent FG-5010Z130-0.2 (manufactured by Fluorosurf Corporation) was applied onto a surface of the amorphous carbon film formed as described above through a dip coating process (fluorine resin content 0.02 to 0.2% and fluorine solvent content 99.8% to 99.98%). The product was dried at room temperature for two days to yield a sample of Example 1.

(2) Production in Example 2

The two stainless steel (SUS304) substrates described above were put into a high-pressure pulsed plasma CVD apparatus. The high-pressure pulsed plasma CVD apparatus was evacuated with vacuum to $1 \times 10^{-3}$ Pa, and then the substrates were cleaned with argon plasma gas for approximately 5 min. After the cleaning, argon gas and tetramethylsilane were introduced into a reaction container at flow rates of 15 SCCM and 10 SCCM, respectively, such that the reaction container had an internal gas pressure of 1.5 Pa, and an amorphous carbon film was formed at an applied voltage of −4 kV, a pulse frequency of 2 kHz, and a pulse width of 50 μs for 30 min. Then, the source gas was discharged, and then oxygen gas was introduced into the reaction container at a flow rate of 14 SCCM such that the reaction container had an internal gas pressure of 1.5 Pa, and the amorphous carbon film was exposed to oxygen plasma at an applied voltage of −3 kV, a pulse frequency of 2 kHz, and a pulse width of 50 μs for 5 min. After the exposure to oxygen plasma, a solution of a fluorine-containing silane coupling agent FG-5010Z130-0.2 (manufactured by Fluorosurf Corporation) was applied onto a surface of the amorphous carbon film through a dip coating process (fluorine resin content 0.02 to 0.2% and fluorine solvent content 99.8% to 99.98%). The product was dried at room temperature for two days to yield a sample of Example 2.

(3) Production in Example 3

An amorphous carbon film was formed with argon and tetramethylsilane as in Example 1. Then, the source gas was discharged, nitrogen gas was subsequently introduced into a reaction container at a flow rate of 15 SCCM such that the reaction container had an internal gas pressure of 1.5 Pa, and then the amorphous carbon film was exposed to nitrogen plasma at an applied voltage of −4 kV, a pulse frequency of 2 kHz, and a pulse width of 50 μs for 5 min. After the exposure to nitrogen plasma, a fluorine-containing silane coupling agent was applied to the amorphous carbon film thorough a dip coating process as in Example 1. The product was dried at room temperature for two days to yield a sample of Example 3.

(4) Production in Example 4

An amorphous carbon film was formed with argon and tetramethylsilane as in Example 1. Then, the source gas was discharged, nitrogen gas was subsequently introduced into a reaction container at a flow rate of 15 SCCM such that the reaction container had an internal gas pressure of 1.5 Pa, and then the amorphous carbon film was exposed to nitrogen plasma at an applied voltage of −4 kV, a pulse frequency of 2 kHz, and a pulse width of 50 μs for 5 min. Then, the nitrogen gas was discharged, oxygen gas was subsequently introduced into the reaction container at a flow rate of 14 SCCM such that the reaction container had an internal gas pressure of 1.5 Pa, and then the amorphous carbon film was exposed to oxygen plasma at an applied voltage of −3 kV, a pulse frequency of 2 kHz, and a pulse width of 50 μs for 5 min. After the exposure to nitrogen plasma and oxygen plasma, a fluorine-containing silane coupling agent was applied to the amorphous carbon film thorough a dip coating process as in Example 1. The product was dried at room temperature for two days to yield a sample of Example 4.

(5) Production in Example 5

The two stainless steel (SUS304) substrates described above were put into a high-pressure pulsed plasma CVD apparatus. The high-pressure pulsed plasma CVD apparatus was evacuated with vacuum to $1 \times 10^{-3}$ Pa, and then the substrates were cleaned with argon plasma gas. After the cleaning, tetramethylsilane and oxygen gas were introduced into a reaction container at flow rates of 15 SCCM and 0.7 SCCM, respectively, such that the reaction container had an internal gas pressure of 1.5 Pa, and an amorphous carbon film was formed at an applied voltage of −4 kV, a pulse frequency of 2 kHz, and a pulse width of 50 μs for 30 min. The mixing ratio of the oxygen gas to tetramethylsilane was adjusted in 4.5% in terms of a flow rate. A fluorine-containing silane coupling agent was applied to a surface of the amorphous carbon film formed in this manner thorough a dip coating process as in Example 1. The product was dried at room temperature for two days to yield a sample of Example 5.

(6) Production in Example 6

The two stainless steel (SUS304) substrates described above were put into a high-pressure pulsed plasma CVD apparatus. The high-pressure pulsed plasma CVD apparatus was evacuated with vacuum to $1 \times 10^{-3}$ Pa, and then the substrates were cleaned with argon plasma gas. After the cleaning, tetramethylsilane and oxygen gas were introduced into a reaction container at flow rates of 15 SCCM and 1.4 SCCM, respectively, such that the reaction container had an internal gas pressure of 1.5 Pa, and an amorphous carbon film was formed at an applied voltage of −4 kV, a pulse frequency of 2 kHz, and a pulse width of 50 μs for 30 min. The mixing ratio of the oxygen gas to tetramethylsilane was adjusted in 8.5% in terms of a flow rate. A fluorine-containing silane coupling agent was applied to a surface of the amorphous carbon film formed in this manner thorough a dip coating process as in Example 1. The product was dried at room temperature for two days to yield a sample of Example 6.

(7) Production in Example 7

The two stainless steel (SUS304) substrates described above were put into a high-pressure pulsed plasma CVD apparatus. The high-pressure pulsed plasma CVD apparatus was evacuated with vacuum to $1 \times 10^{-3}$ Pa, and then the substrates were cleaned with argon plasma gas. After the cleaning, argon and tetramethylsilane were introduced into a reaction container at flow rates of 15 SCCM and 10 SCCM, respectively, such that the reaction container had an internal gas pressure of 1.5 Pa, and a film was formed at an applied voltage of −4 kV, a pulse frequency of 2 kHz, and a pulse width of 50 μs for approximately 10 min. Through this process, an Si-containing amorphous carbon film was formed as an underlying interlayer on a surface of the substrate. Then, acetylene was introduced into the reaction container at a flow rate of 20 SCCM such that the reaction container had an internal gas pressure of 1.5 Pa, and a film was formed at an applied voltage of −4 kV, a pulse frequency of 2 kHz, and a pulse width of 50 μs for 30 min. Through this process, an Si-free amorphous carbon film was formed on a surface of the underlying interlayer. Then, the source gas was discharged, oxygen gas was subsequently introduced into the reaction container at a flow rate of 14 SCCM such that the reaction container had an internal gas pressure of 1.5 Pa, and then the amorphous carbon film was exposed to oxygen plasma at an applied voltage of −4 kV, a pulse frequency of 2 kHz, and a pulse width of 50 μs for 5 min. After the exposure to oxygen plasma, a fluorine-containing silane coupling agent was applied to a surface of the amorphous carbon film thorough a dip coating process as in Example 1. The product was dried at room temperature for two days to yield a sample of Example 7.

(8) Production in Example 8

As in Example 7, an Si-containing amorphous carbon film was formed as an underlying interlayer on a stainless steel (SUS304) substrate, and an Si-free amorphous carbon film was formed on a surface of the underlying interlayer. In the present example, the source gas was discharged, nitrogen gas was subsequently introduced into a reaction container at a flow rate of 14 SCCM such that the reaction container had an internal gas pressure of 1.5 Pa, and then the amorphous carbon film was exposed to nitrogen plasma at an applied voltage of −4 kV, a pulse frequency of 2 kHz, and a pulse width of 50 μs for 5 min. After the exposure to nitrogen plasma, a fluorine-containing silane coupling agent was applied to a surface of the amorphous carbon film thorough a dip coating process as in Example 1. The product was dried at room temperature for two days to yield a sample of Example 8.

(9) Production in Example 9

As in Example 7, an Si-containing amorphous carbon film was formed as an underlying interlayer on a stainless steel (SUS304) substrate, and an Si-free amorphous carbon film was formed on a surface of the underlying interlayer. In the present example, the source gas was discharged, nitrogen gas was subsequently introduced into a reaction container at a flow rate of 14 SCCM such that the reaction container had an internal gas pressure of 1.5 Pa, and then the amorphous carbon film was exposed to nitrogen plasma at an applied voltage of −4 kV, a pulse frequency of 2 kHz, and a pulse width of 50 µs for 5 min. Then, the nitrogen gas was discharged, oxygen gas was subsequently introduced into the reaction container at a flow rate of 14 SCCM such that the reaction container had an internal gas pressure of 1.5 Pa, and then the amorphous carbon film was exposed to oxygen plasma at an applied voltage of −3 kV, a pulse frequency of 2 kHz, and a pulse width of 50 µs for 5 min. After the exposure to nitrogen plasma and oxygen plasma, a fluorine-containing silane coupling agent was applied to a surface of the amorphous carbon film thorough a dip coating process as in Example 1. The product was dried at room temperature for two days to yield a sample of Example 9.

(10) Production in Comparative Example 1

As in Example 7, an Si-containing amorphous carbon film was formed as an underlying interlayer on an SUS304 substrate. In the present comparative example, the source gas was discharged, acetylene was subsequently introduced into a reaction container at a flow rate of 20 SCCM such that the reaction container had an internal gas pressure of 1.5 Pa, and then a film was formed at an applied voltage of −4 kV, a pulse frequency of 2 kHz, and a pulse width of 50 µs for 30 min. Through this process, an Si-free amorphous carbon film was formed on the underlying interlayer. A fluorine-containing silane coupling agent was applied to the Si-free amorphous carbon film thorough a dip coating process as in Example 1. The product was dried at room temperature for two days to yield a sample of Comparative Example 1.

2. Measurement of Wettability

Each of the samples of Examples 1 to 7 and Comparative Example 1 was subjected to measurement of wettability to mineral spirit (oil). The measurement was carried out with a portable contact angle analyzer "PG-X" (manufactured by FIBRO System AB, mobile contact angle tester) at a room temperature of 25° C. and a humidity of 30%. In order to analyze the fixability of a fluorine-containing silane coupling agent, each of the samples of Examples 1 to 7 and Comparative Example 1 was put into acetone and subjected to ultrasonic cleaning for 120 min, and then each sample was subjected to measurement of a contact angle with mineral spirit after the ultrasonic cleaning. In the ultrasonic cleaning process, each sample was continuously subjected to ultrasonic cleaning for 60 min, subsequently allowed to stand for 60 min without the ultrasonic cleaning, and then further subjected to ultrasonic cleaning for 60 min. In this case, since it is assumed that the fluorine-containing silane coupling agent in the sample of Comparative Example 1 would be removed in a short time during the ultrasonic cleaning, the sample of Comparative Example 1 was subjected to the ultrasonic cleaning only for 5 min, and a contact angle was measured after the 5-min ultrasonic cleaning. The ultrasonic cleaning was carried out with an ultrasonic cleaner (product name "US-20KS", commercially available from SND Co., Ltd., oscillation: 38 kHz (bolt-clamped Langevin type transducer (BLT) self-oscillation), high-frequency output 480 W). In the ultrasonic cleaning, the vibration of a piezoelectric vibrator generated cavitation (air bubbles) in acetone, and the air bubbles were broken on a surface of the substrate while applying large physical impact force on the surface of the substrate, resulting in the removal of a fluorine-containing silane coupling agent exhibiting a weak binding to the under layer. Hence, measurement of a contact angle on the surface of the substrate after the ultrasonic cleaning enabled analysis of the adhesion between a fluorine-containing silane coupling agent and the under layer thereof.

Figure 11:
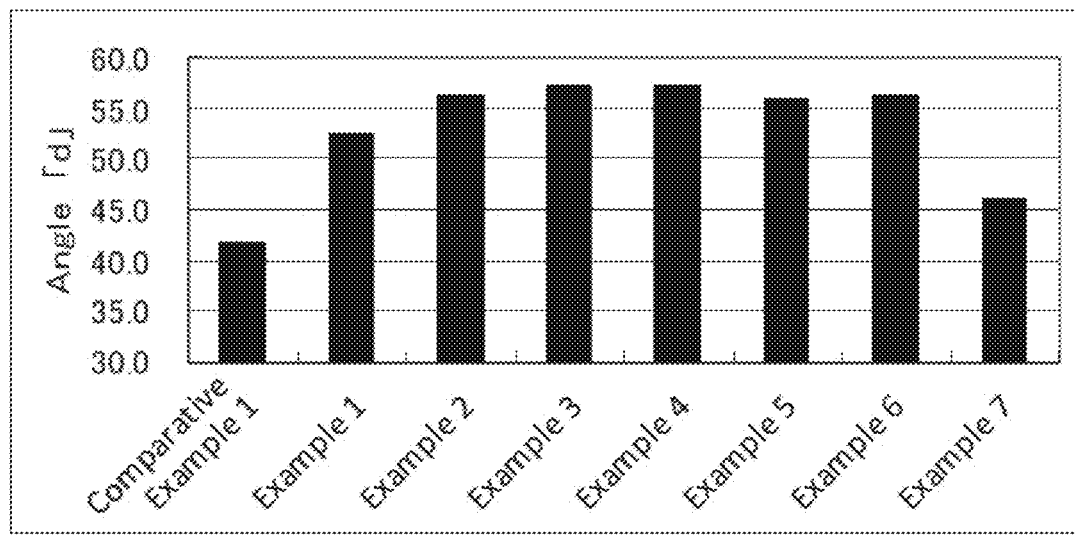
FIG. 11 is a graph illustrating results of measurement of contact angles with mineral spirit in Examples 1 to 7 and Comparative Example 1.

FIG. 11 is a graph illustrating results of the measurement of a contact angle with mineral spirit in Examples 1 to 7 and Comparative Example 1, and each result shows the average value of contact angles determined at 16 points on the substrate. The drawing elucidates that the sample of Comparative Example 1 after the ultrasonic cleaning for 5 min exhibited a reduction in a contact angle to approximately 40°. In contrast, each of the samples of Examples 1 to 7 exhibited a contact angle of not less than 45° even after the ultrasonic cleaning for 120 min. Particularly, each of the samples of Examples 1 to 6 having the Si-incorporated amorphous carbon film exhibited a contact angle of not less than 50°. Each result of the measurement demonstrates that a sufficient amount of fluorine-containing silane coupling agent was remaining on a surface of each of the samples of Examples to exhibit a water-oil-repellent property.

Figure 12:
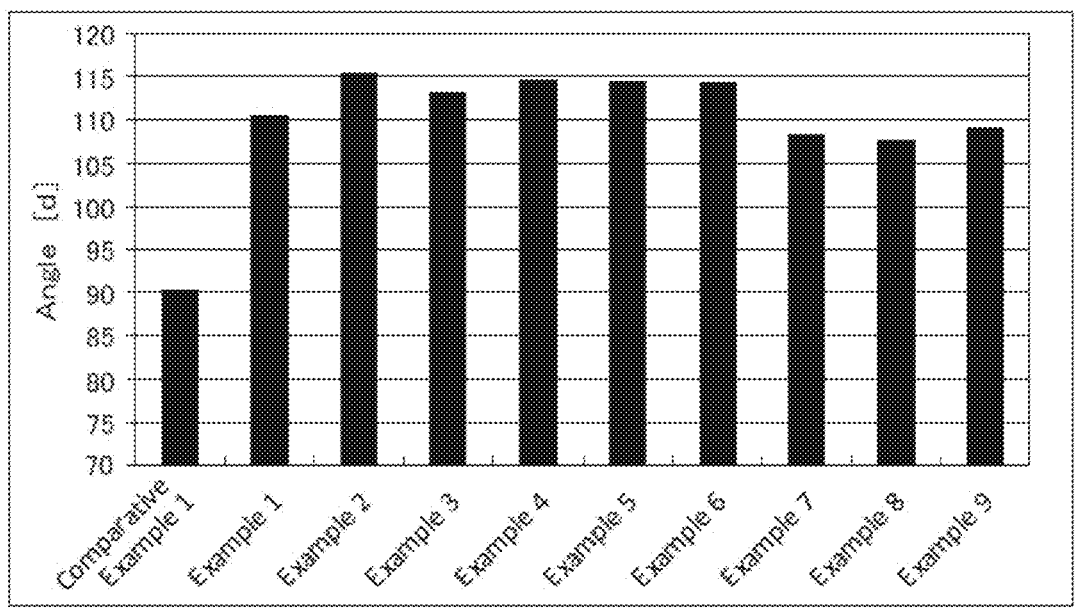
FIG. 12 is a graph illustrating results of measurement of contact angles with water in Examples 1 to 9 and Comparative Example 1.

Wettability to water (pure water) was measured. The measurement was carried out as in the measurement of wettability to mineral spirit. Each of the samples of Examples 1 to 9 and Comparative Example 1 was put into acetone and then subjected to ultrasonic cleaning for 5 min, and then each sample was subjected to measurement of a contact angle with water after the ultrasonic cleaning. FIG. 12 is a graph illustrating results of the measurement of a contact angle with water in Examples 1 to 9 and Comparative Example 1, and each result shows the average value of contact angles determined at 10 points on a substrate. The drawing elucidates that Comparative Example 1 exhibited a contact angle of approximately 90°; in contrast, each of Examples 1 to 9 exhibited a contact angle of not less than 105°. Each result of the measurement demonstrates that a sufficient amount of fluorine-containing silane coupling agent was remaining on a surface of each of the samples of Examples to exhibit a water-oil-repellent property.

These results of the measurement of contact angles demonstrate that imparting any of the film structures of Examples 1 to 9 to the opening of a screen printing stencil was able to reduce the residual paste in the opening (such as illustrated in FIG. 9), the film structures each having the amorphous carbon film and the fluorine-containing silane coupling agent.

Figure 13:
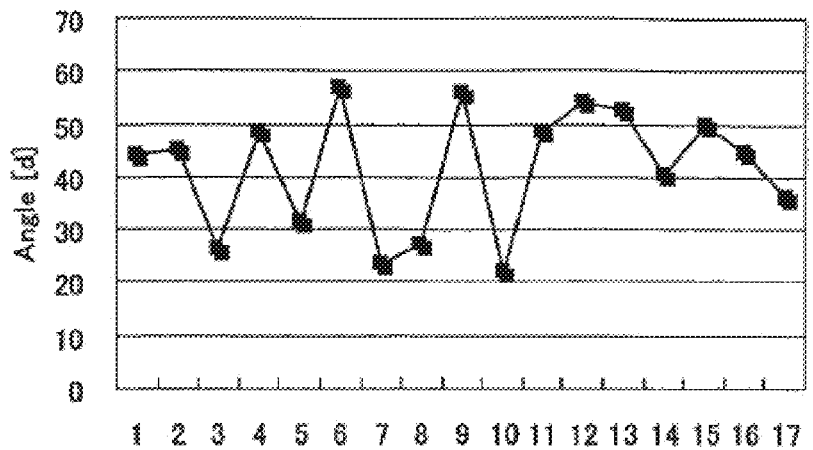
FIG. 13 is a graph illustrating results of measurement of contact angles with mineral spirit at multiple points on a surface of a sample of Comparative Example 1.
Figure 14:
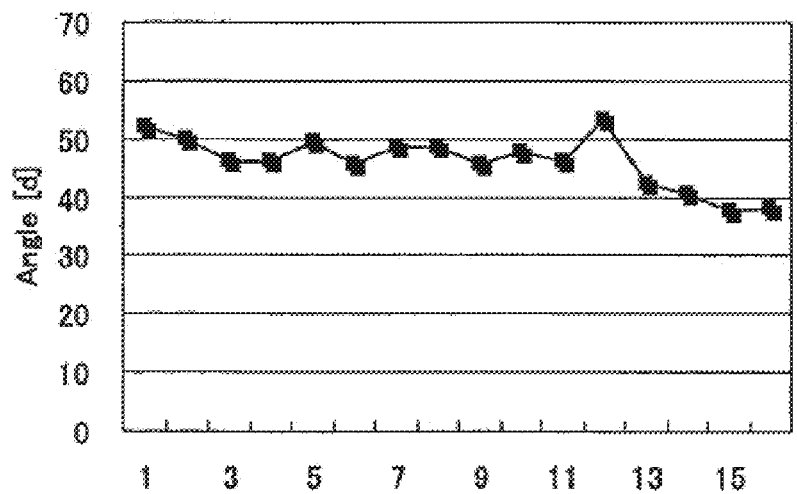
FIG. 14 is a graph illustrating results of measurement of contact angles with mineral spirit at multiple points on a surface of a sample of Example 7.

FIG. 13 is a graph illustrating results of the measurement of a contact angle with mineral spirit in Comparative Example 1 after the ultrasonic cleaning for 5 min, the measurement being carried out at multiple points (measurement points) on a surface of the sample of Comparative Example 1. FIG. 14 is a graph illustrating results of the measurement of a contact angle with mineral spirit in Example 7 after the ultrasonic cleaning for 120 min, the measurement being carried out at multiple points (measurement points) on a surface of the sample of Example 7. FIGS. 13 and 14 elucidate that Comparative Example 1 exhibited a large variation in a contact angle (Max-Min) depending on the measurement points;

thus, the fluorine-containing silane coupling agent was removed. Example 7 exhibited a relatively even contact angle.

In each of Examples 2 to 6, after the formation of the silicon-containing amorphous carbon film, the silicon-containing source gas was discharged, oxygen and/or nitrogen was subsequently introduced, and then the exposure to plasma was carried out, without vacuum break in a reaction container; however, the reaction container may be returned to a normal pressure state after the formation of the silicon-containing amorphous carbon film, and then the reaction container may be brought into a vacuum state again for introduction of oxygen and/or nitrogen. Even in the case where the reaction container was returned to a normal pressure state before the exposure to plasma in this manner, contact angles with water and mineral spirit were substantially the same as those in Examples.

The invention claimed is:

1. A screen printing plate comprising:
   a mesh fixed to a frame body;
   an emulsion layer that fills up the mesh and has a through-hole;
   an amorphous carbon film formed on at least part of an inner wall of the through-hole and comprised of at least one element selected from the group consisting of silicon, oxygen, nitrogen, and mixtures thereof; and
   a thin film of a fluorine-containing silane coupling agent formed on at least part of the amorphous carbon film.

2. The screen printing plate according to claim 1, wherein the amorphous carbon film is exposed to plasma with any one of nitrogen, oxygen, and a mixture of nitrogen and oxygen.

3. The screen printing plate according to claim 1, wherein the amorphous carbon film is further formed on a surface of the mesh.

4. The screen printing plate according to claim 1, wherein the amorphous carbon film is further formed on a surface of the emulsion layer.

5. The screen printing plate according to claim 1, wherein the emulsion layer has a lower surface disposed so as to face a recording medium, and the thin film of the fluorine-containing silane coupling agent is provided on the inner wall of the through-hole on the lower surface of the emulsion layer.

6. The screen printing plate according to claim 5, wherein the thin film of the fluorine-containing silane coupling agent is provided on the lower surface in a vicinity of the through-hole.

7. The screen printing plate according to claim 1, wherein the thin film of the fluorine-containing silane coupling agent is provided on the entire inner wall of the through-hole.

8. A screen printing mask comprising:
   a mask substrate directly attached to a frame body or indirectly attached through a mesh, the mask substrate having a through-hole;
   an amorphous carbon film formed on at least part of an inner wall of the through-hole and comprised of at least one element selected from the group consisting of silicon, oxygen, nitrogen, and mixtures thereof; and
   a thin film of a fluorine-containing silane coupling agent formed on at least part of the amorphous carbon film.

9. The screen printing mask according to claim 8, wherein the amorphous carbon film is exposed to plasma with any one of nitrogen, oxygen, and a mixture of nitrogen and oxygen.

10. The screen printing mask according to claim 9, wherein the thin film of the fluorine-containing silane coupling agent is provided on the entire inner wall of the through-hole.

11. The screen printing mask according to claim 8, wherein the mask substrate is formed from a metallic plate and the amorphous carbon film is further formed on a surface of the metallic plate.

12. The screen printing mask according to claim 8, wherein the mask substrate has a lower surface disposed so as to face a recording medium, and the thin film of the fluorine-containing silane coupling agent is provided on the inner wall of the through-hole on the lower surface of the mask substrate.

13. The screen printing mask according to claim 12, wherein the thin film of the fluorine-containing silane coupling agent is provided on the lower surface in a vicinity of the through-hole.

14. The screen printing mask according to claim 8, wherein the mask substrate is formed from any one of a metallic plate and a resin plate.

15. A screen printing mask comprising:
    a mesh fixed to a frame body;
    a mask substrate attached to one surface of the mesh and having a through-hole;
    an amorphous carbon film formed on at least part of an inner wall of the through-hole and comprised of at least one element selected from the group consisting of silicon, oxygen, nitrogen, and mixtures thereof; and
    a thin film of a fluorine-containing silane coupling agent formed on at least part of the amorphous carbon film.

16. The screen printing mask according to claim 15, wherein the amorphous carbon film is exposed to plasma with any one of nitrogen, oxygen, and a mixture of nitrogen and oxygen.

17. The screen printing mask according to claim 15, wherein the amorphous carbon film is further formed on a surface of the mesh.

18. The screen printing mask according to claim 15, wherein the amorphous carbon film is further formed on a surface of the mask substrate.

19. The screen printing mask according to claim 15, wherein the mask substrate has a lower surface disposed so as to face a recording medium, and the thin film of the fluorine-containing silane coupling agent is provided on the inner wall of the through-hole on the lower surface of the mask substrate.

20. The screen printing mask according to claim 19, wherein the thin film of the fluorine-containing silane coupling agent is provided on the lower surface in the vicinity of the through-hole.

21. The screen printing mask according to claim 15, wherein the thin film of the fluorine-containing silane coupling agent is provided on the entire inner wall of the through-hole.

22. The screen printing mask according to claim 15, wherein the mask substrate is formed from metallic foil selected from the group consisting of nickel foil, nickel alloy foil, and stainless steel foil.

23. A method for manufacturing a screen printing plate, the method comprising:
    fixing a mesh to a frame body;
    filling up the mesh with an emulsion to form an emulsion layer;
    forming a through-hole in the emulsion layer at a position corresponding to a print pattern;
    forming an amorphous carbon film on at least part of an inner wall of the thorough-hole, the amorphous carbon film being comprised of at least one element selected from the group consisting of silicon, oxygen, nitrogen, and mixtures thereof; and forming a thin film of a fluorine-containing silane coupling agent on at least part of the amorphous carbon film.

24. A method for manufacturing a screen printing mask, the method comprising:
- directly fixing a mask substrate to a frame body or indirectly fixing the mask substrate through a mesh, wherein the mask substrate is formed from a metallic plate and;
- forming a through-hole in the metallic plate at a position corresponding to a print pattern;
- forming an amorphous carbon film on at least part of an inner wall of the thorough-hole, the amorphous carbon film being comprised of at least one element selected from the group consisting of silicon, oxygen, nitrogen, and mixtures thereof; and
- forming a thin film of a fluorine-containing silane coupling agent on at least part of the amorphous carbon film.

25. A method for manufacturing a screen printing mask, the method comprising:
- fixing a mesh to a frame body;
- attaching a mask substrate to one surface of the mesh, the mask substrate having a through-hole;
- forming an amorphous carbon film on at least part of an inner wall of the thorough-hole, the amorphous carbon film being comprised of at least one element selected from the group consisting of silicon, oxygen, nitrogen, and mixtures thereof; and
- forming a thin film of a fluorine-containing silane coupling agent on at least part of the amorphous carbon film.

\* \* \* \* \*